United States Patent
Granquist-Fraser

(10) Patent No.: US 8,395,685 B2
(45) Date of Patent: Mar. 12, 2013

(54) WIDE DYNAMIC RANGE IMAGING SENSOR AND METHOD

(75) Inventor: Domhnull Granquist-Fraser, Acton, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 1131 days.

(21) Appl. No.: 12/168,531

(22) Filed: Jul. 7, 2008

(65) Prior Publication Data

US 2010/0002106 A1    Jan. 7, 2010

(51) Int. Cl.
*H04N 3/14* (2006.01)
*H04N 5/335* (2011.01)

(52) U.S. Cl. .................. 348/296; 348/297

(58) Field of Classification Search .......... 359/274–277, 359/342, 221.1; 348/274–277, 342, 221.1, 348/308, 310
See application file for complete search history.

(56) References Cited

U.S. PATENT DOCUMENTS

| | | |
|---|---|---|
| 5,965,875 A | 10/1999 | Merrill |
| 6,965,102 B1 | 11/2005 | Merrill |
| 2004/0178467 A1 * | 9/2004 | Lyon et al. ............. 257/440 |
| 2008/0291312 A1 * | 11/2008 | Egawa ..................... 348/308 |
| 2009/0160981 A1 * | 6/2009 | Baumgartner et al. ...... 348/274 |

OTHER PUBLICATIONS

Foveon, Inc., "Foveon X3 Fx17-78-F13 Image Sensor" Product Brief [online] [retrieved on Jul. 12, 2007]. Retrieved from the Internet: <URL: http://www.foveon.com/files/F13_image_sensor_Product_Filter_RevD.pdf.>.

* cited by examiner

*Primary Examiner* — Alicia M Harrington
(74) *Attorney, Agent, or Firm* — Foley & Lardner, LLP; Matthew L. Fenselau

(57) ABSTRACT

A system and method for sensing an optical input having a wide dynamic range includes providing a semiconductor material extending along a reference axis away from an optical input surface and having more than one substantially planar photodetecting regions disposed therein at different respective depths. The substantially planar photodetecting regions are configured to be overlapping and at least partially transverse to the reference axis, such that more than one of the regions absorb the optical input received through the optical input surface. Each of the photodetecting regions has an associated responsivity representative of the absorption of the incident optical signal. Preferably, the responsivity of each of the photodetecting regions is different for each of the photodetecting regions. A wide dynamic range sensor signal is produced by combining electrical output signals obtained from each of the more than one photodetecting regions.

13 Claims, 11 Drawing Sheets

WIDE DYNAMIC RANGE IMAGING SENSOR AND METHOD

FIELD

The present invention relates generally to the field of imaging sensors. More particularly, the present invention relates to imaging sensors having a wide dynamic range.

RELATED ART

The dynamic range of a sensor is typically defined as the ratio of the largest signal measurable by the sensor before saturating to the minimal detectable signal. More specifically, the dynamic range may be defined as the ratio between the largest and the smallest signals that a sensor is capable of detecting. In an imaging sensor, certain limitations may affect the signal output. For example, the maximum signal is limited by the size of the signal integration well, while the smallest signal is limited by the noise floor of the sensor. Most known imaging technologies cannot utilize the full range of human and machine signal processing, analysis, and interpretation abilities, primarily due to the limited dynamic ranges of state of the art sensors. Such known limitations may affect the accuracy and depth of information available for analyses of data being employed for purposes relating to defense or military intelligence, biomedical diagnosis, environmental monitoring, and other scientific efforts that utilize imagery. In such cases, providing a wider dynamic range enables the acquisition of targeted images that are typically obscured by the effects shadows or glare. Additionally, a wider dynamic range provides for greater discrimination performance from image processing and machine intelligence algorithms, such as those for object recognition.

With respect to image sensors, there are numerous examples of related art approaches to provide a wider dynamic range. One of the known state of the art approaches includes well capacity adjusting. Such a method is accomplished by using a lateral overflow drain to temporarily saturate high-strength signals. By turning off the lateral overflow drain after a period of time, the integration of large signals can resume, thereby compressing this portion of the device response and increasing the dynamic range. The well capacity adjustment can be implemented multiple times during the signal integration.

A second approach to providing a wider dynamic range includes multiple capture for contrast blending. This method is accomplished by taking sequential exposures of the image. More specifically, this is accomplished by sliding the dynamic range of the imaging sensor along the scene's intensity range. The multiple capture method accomplishes this by taking several exposures of the same scene with varying exposure times. The shorter exposures capture details in bright portions of the scene, while longer exposures capture details in less bright portions of the scene. The increase in dynamic range is given by the ratio of the longest exposure time divided by the shortest. The exposures may be of varying temporal length and are configured to be combined into a single high dynamic range image. However, by using this approach, several disadvantages may become apparent. Particularly, one disadvantage to this method is that images may be lost or blurred by achieving the increased dynamic range in this manner due to changes in the position of the image between exposures. Secondly, the individual exposures will usually require registration due to camera movement greatly increasing post-processing time and decreasing image fidelity.

A third approach for providing a wider dynamic range involves spatially varying exposure. The method of spatially varying exposure varies a sensor's dynamic range with the scene's intensity dynamic range, by using neutral density filters. Thus, dark filters are used to record detail in bright areas of the scene and allows for a long exposure. The long exposure allows the pixels with no neutral density filter to capture images in the dim areas of a scene. The increase in dynamic range is equal to the ratio of the inverse transmissivities of the darkest neutral density filter to the clearest. A sliding 2×2 (two-by-two) summation yields a high dynamic range image. Dynamic range increase is dependent on ration between highest and lowest transmission values of neutral density filters. Each 2×2 pixel neighborhood contains a complete set of neutral density filters. The image is taken in a single frame; however, the aggregation of the 2×2 pixel neighborhoods lowers the spatial resolution of the resulting image.

A fourth approach to providing a wider dynamic range can be referred to as a time-to-saturation method. The time-to-saturation method requires the measurement of the time interval for each pixel to reach saturation rather than repetitively sampling each pixel at set synchronous times. This approach requires a high degree of integration of signal processing electronics at the pixel level, resulting in large pixels, which limits the total number of pixels on a sensor of this type. The time to saturation method requires each pixel to have its own ADC, lowering fill-factor (i.e., area percentage of pixel used for photon detection), which lowers the fidelity of the image and lowers resolution by increased pixel size (i.e., fewer pixels on a device) or necessitates much larger devices.

A fifth approach to providing a wider dynamic range involves use of a logarithmic sensor. In a logarithmic sensor, photocurrent is converted directly to voltage for read-out. Logarithmic sensors exhibit response curves similar to well-capacity-adjustment devices, in that they increase dynamic range but not bit depth. This results in the resolution of higher intensity signals being lowered. The MOSFET in the sensor is configured to provide the logarithmic response.

A sixth approach to providing a wider dynamic range is local adaptation. This form of adaptation is one of the methods for dynamic range increase used in mammalian vision. In neurobiology, this is known as an on-center/off surround response. It not only removes the local bias, but causes a spatial high-pass filtering of the signal.

Each of these approaches for providing dynamic range imaging has associated with it at least some undesirable limitation. Accordingly, there is a need for an improved method for providing wide dynamic range imaging.

SUMMARY OF THE INVENTION

Advantageously, a contrast blending solution utilizes multiple sensor integration wells arranged at least partially along a common optical axis. For example, the multiple wells can be stacked vertically in every pixel of the image. The differential responsivity of each of the multiple wells of a given pixel can be used to generate a contrast blending of that pixel. Such an approach is capable of revealing and tracking low contrast images that would otherwise be obscured by shadows or glint in conventional sensors. Such an approach also provides a high image discrimination ability for object recognition, and provides neighborhood independent pixel operation to include blooming isolation, without degradation in temporal or spatial resolution due to radiometric dynamic range increase.

One aspect of the invention relates to a method for capturing a wide dynamic range image using a semiconductor material. The semiconductor material includes more than one substantially planar regions positioned along a principal axis. The method includes exposing the semiconductor material to an optical signal, wherein the optical signal is directed in a path substantially incident on a face of the semiconductor material. The semiconductor material is configured such that the more than one substantially planar regions absorb the incident optical signal. The method further includes detecting a spatial charge distribution present in the more than one substantially planar regions of the semiconductor material, wherein the planar regions are configured to be at least partially transverse to the principal axis. The spatial charge distribution of each of the substantially planar regions has a photo-generation coefficient representative of the absorption of the incident optical signal. The method also includes the step of generating an imaging signal representative of an aggregated sum of the spatial charge distributions in each of the more than one substantially planar regions of the semiconductor material. The integral of the photo-generation coefficient of each of the substantially planar regions over a predetermined wavelength of the incident optical signal is different for each of the substantially planar regions of the semiconductor material.

Another aspect of the invention relates to a method for generating a wide dynamic range image. The method includes the step of providing a semiconductor block extending from an input face along a reference axis, wherein points in the semiconductor block are characterized by hole-electron pair photocharge generation coefficient as a function of wavelength of incident illumination across a predetermined wavelength range. The method further includes directing an optical signal to be incident on the input face, in order to generate a photo-generated spatial charge distribution in the semiconductor block. The method also includes detecting the photo-generated spatial charge distribution resident in more than one substantially planar regions of the semiconductor block, wherein the more than one substantially planar regions are (i) non-intersecting, (ii) at least partially transverse to the reference axis, (iii) mutually spaced apart along the reference axis, and (iv) overlapping in the direction of the reference axis. Additionally, the method includes generating an image signal representative of a weighted sum of the detected spatial charge distributions for the more than one substantially planar regions of the semiconductor block, wherein each of the weights of the weighted sum is proportional to the integral of the photocharge generation coefficient over the predetermined wavelength range for the respective substantially planar region.

Another aspect of the invention relates to a high dynamic range image detector, including a semiconductor block extending from an input face along a reference axis, wherein points in the semiconductor block are characterized by hole-electron pair photocharge generation coefficient as a function of wavelength of incident illumination across a predetermined wavelength range. The semiconductor block is responsive to an optical signal incident on the input face, in order to generate a photo-generated spatial charge distribution in the semiconductor block. The detector further includes means for detecting the photo-generated spatial charge distribution resident in more than one substantially planar regions of the semiconductor block, wherein the more than one substantially planar regions are (i) non-intersecting, (ii) at least partially transverse to the reference axis, and (iii) mutually spaced apart along the reference axis. The detector also includes means for providing an image signal representative of a weighted sum of the detected spatial charge distributions for the more than one substantially planar regions of the semiconductor block, wherein each of the weights of the weighted sum is proportional to the integral of the photocharge generation coefficient over the predetermined wavelength range for the respective substantially planar region.

In yet another aspect, the invention relates to a high dynamic range imaging sensor element including a semiconductor material extending away from an optical input surface along a reference axis. Multiple substantially planar, non-intersecting photodetecting junctions are each disposed within the semiconductor material, providing a respective output signal responsive to an optical input. Each of the photodetecting junctions is also at least partially transverse to the reference axis, mutually spaced apart along the reference axis, and overlapping in the direction of the reference axis. The imaging sensor element also includes a signal combiner. The signal combiner is in electrical communication with at least two of the multiple photodetecting junctions and provides a high dynamic range output signal that is derived from the output signals of each of at least two photodetecting junctions. The dynamic range of the high dynamic range output signal is greater than a dynamic range of any one of the at least two photodetecting junctions.

In another aspect the invention relates to a high dynamic range imaging sensor element including a semiconductor material extending away from an optical input surface along a reference axis. The pixel element also includes multiple substantially planar, non-intersecting photodetecting junctions, each disposed within the semiconductor material. Each of the photodetecting junctions provides a respective output signal responsive to an optical input. Each of the photodetecting junctions is also at least partially transverse to the reference axis, mutually spaced apart along the reference axis, and overlapping in the direction of the reference axis. The imaging sensor element also includes and an optical filter positioned between the optical input surface and the optical input. The optical filter restricts operation of the multiple photodetecting junctions to a preferred spectral region.

In yet another aspect, the invention relates to a process for generating a wide dynamic range of operation in imaging sensor element. The process includes providing a semiconductor material extending away from an optical input surface along a reference axis. The semiconductor material has an associated attenuation coefficient and produces hole-electron pairs in response to incident illumination. The hole-electron pairs are produced at various depths measured from the optical input surface along the reference axis. An optical input is received incident upon the optical input surface. A respective output signal is detected responsive to the optical input at each of the multiple photodetecting junctions disposed within the semiconductor material. The multiple photodetecting junctions are substantially planar, non-intersecting, at least partially transverse to the reference axis, mutually spaced apart along the reference axis, and overlapping in the direction of the reference axis. Output signals from least two of the plurality of photodetecting junctions are combined, such that the combination yields a wider dynamic range output signal than that provided by any one of the at least two photodetecting junctions.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
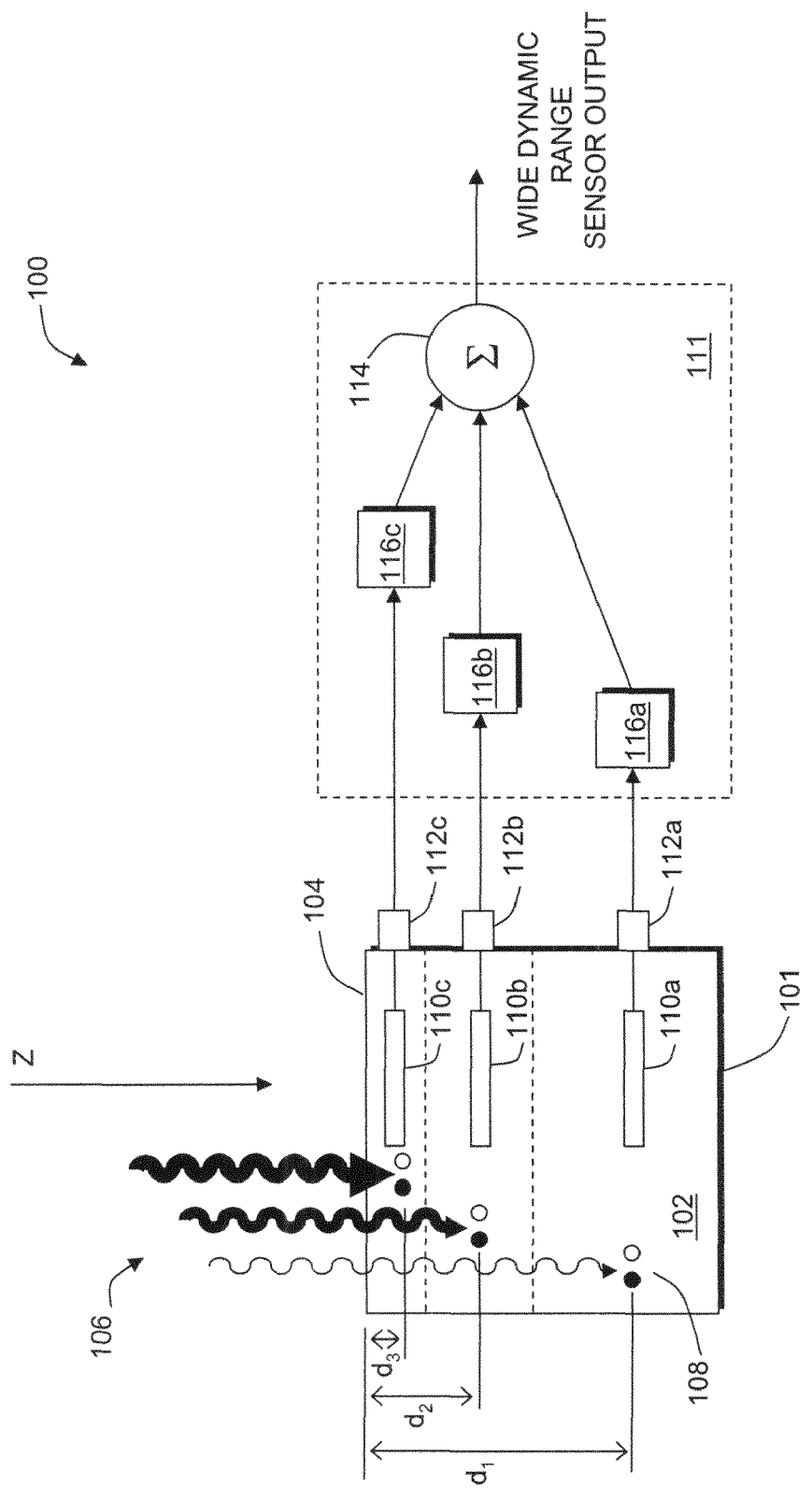
FIG. 1 is a schematic diagram of an exemplary embodiment of a wide dynamic range imaging sensor element constructed in accordance with the present invention.

Now referring to FIG. 1, an exemplary embodiment of a wide dynamic range imaging sensor 100 includes a sensor portion 101 and a processing portion 111. The sensor portion 101 includes a semiconductor material 102 having an optical input surface 104 for receiving incident optical input. In the exemplary sensor, three photosensors 110a, 110b, 110c (generally 110) are disposed at different depths within the semiconductor material 102. In general, more than one photosensor is included. As shown, the first photosensor 110a is positioned at a depth $d_1$ measured along a reference axis 'Z' (i.e., an optical axis) from the optical input surface 104. The second photosensor 110b is similarly positioned at a different depth $d_2$, and the third photosensor 110c is positioned at yet another different depth $d_3$. In the illustrative example, the photosensors 110 are arranged with a relationship $d_1 > d_2 > d_3$. Each of the photosensors 110 is in electrical communication with a respective output terminal 112a, 112b, 112c (generally 112) of the sensor portion 101. In some embodiments, each of the photosensors 110 is in electrical communication with two or more output terminals. Each photosensor 110 converts an optical input into a respective electrical output signal detectable at its respective output terminal 112. Each of the multiple output terminals 112 is in electrical communication with the processing portion 111, for further processing of the electrical signals. In the exemplary embodiment, the processing portion 111 includes a signal combiner 114. The signal combiner 114 combines output signals from more than one of the individual photosensors 110 to produce a wide dynamic range output signal.

In some embodiments, the photosensors 110 are planar, or at least have substantial planar regions. The planar regions are non-intersecting and arranged to be at least partially transverse to the reference axis. For example, the non-intersecting planar regions of the photosensors 110 can be mutually spaced apart along the reference axis (i.e., the optical axis Z), as shown in FIG. 1. In some embodiments, the planar regions of the photosensors 110 are overlapping in the direction of the optical axis. Thus, the photosensors 110 are at a variety of different depths from the surface 104, while being co-located within a single picture element (i.e., pixel). For example, in an image array each of the photosensors 110 of a given pixel share the same row and column index of the array. In some embodiments, the photosensors 110 are overlapping. Alternatively or in addition, the photosensors of a give pixel are axially co-located.

In some embodiments, the processing portion 111 includes one or more signal conditioning elements 116a, 116b, 116c (generally 116). In the exemplary embodiment a respective one of the signal conditioning elements 116 is coupled between each output terminal 112 and the signal combiner 114. Each signal conditioning element 116 can alter a signal, for example, by changing its amplitude. Thus, each signal conditioning element 116 can include one or more of an attenuator, an amplifier, a buffer, a switch, and a filter.

In some embodiments, the signal combiner 114 is a current-summing node, such as a hard-wired interconnection. In other embodiments, the signal combiner can include any suitable electrical circuit for combining more than one signals. Such signal combining circuits can be formed from one or more passive elements, such as resistors, capacitors, and inductors, and/or one or more active elements, such as diodes, transistors, and operational amplifiers. The output of the signal combiner 114 represents a combination of the conditioned photosensor output signals, resulting an a wide dynamic range sensor output for the respective pixel.

In operation, an optical input 106 including light of various wavelengths is received through the optical input surface 104. Preferably, the semiconductor material 102 has optical properties. Thus, a portion of incident light 106 may be reflected at the surface, and another portion of the incident light transmitted into the semiconductor material 102. At least a portion of the transmitted light is absorbed within the semiconductor material 102 according to an absorption coefficient of the particular semiconductor material 102 used. By the absorption process, photons of the incident light 106 having sufficient energy, result in the production of electron-hole pairs 108 at various depths within the semiconductor material 102. The depth at which such absorption occurs can be referred to as an absorption length—i.e., a mean free path through which incident light travels within the semiconductor material 102 before creating an electron-hole pair 108. Due to physical properties of the semiconductor 102, the absorption length varies depending upon wavelength. Generally, longer absorption lengths are associated with longer wavelengths.

In some embodiments, each of the photosensors 110 includes a p-n junction (e.g., a photodiode) formed within the semiconductor material. Through mechanisms well understood by those skilled in the art of semiconductor devices, photons incident in or near a depletion region of each p-n junction and having sufficient energy will produce an electron-hole pair 108. Carrier pairs 108 so generated near the junction are separated and swept under the influence of an electric field to produce an electrical current in an external circuit. For example, a photosensor 110 includes a photodiode to which an external voltage can be applied to the terminals 112 to reverse bias the photodiode. Photons incident upon such a reverse biased photodiode will produce an electrical current. Performance of the photosensor 110 can be described by one or more of a quantum efficiency (i.e., number of electrons collected per number of incident photons) and a responsivity (i.e., photocurrent produced per incident watt of optical power). In general, the photosensor 110 produces an electrical output that is substantially proportional to an optical input.

Some exemplary photosensors include phototransistors and photodiodes, such as p-n photodiodes, p-i-n photodiodes. Other photosensors that include internal gain include avalanche photodiodes, such as silicon reach through avalanche photodiodes, germanium avalanche photodiodes, and III-V alloy avalanche photodiodes. It is envisioned that one or more of these devices can be used within the wide dynamic range imaging sensor 100. In some embodiments, the sensor portion is provided by a pixel of the Foveon Fx 17-78-F13 image sensor, commercially available from Foveon Inc., of Santa Clara, Calif.

Figure 2:
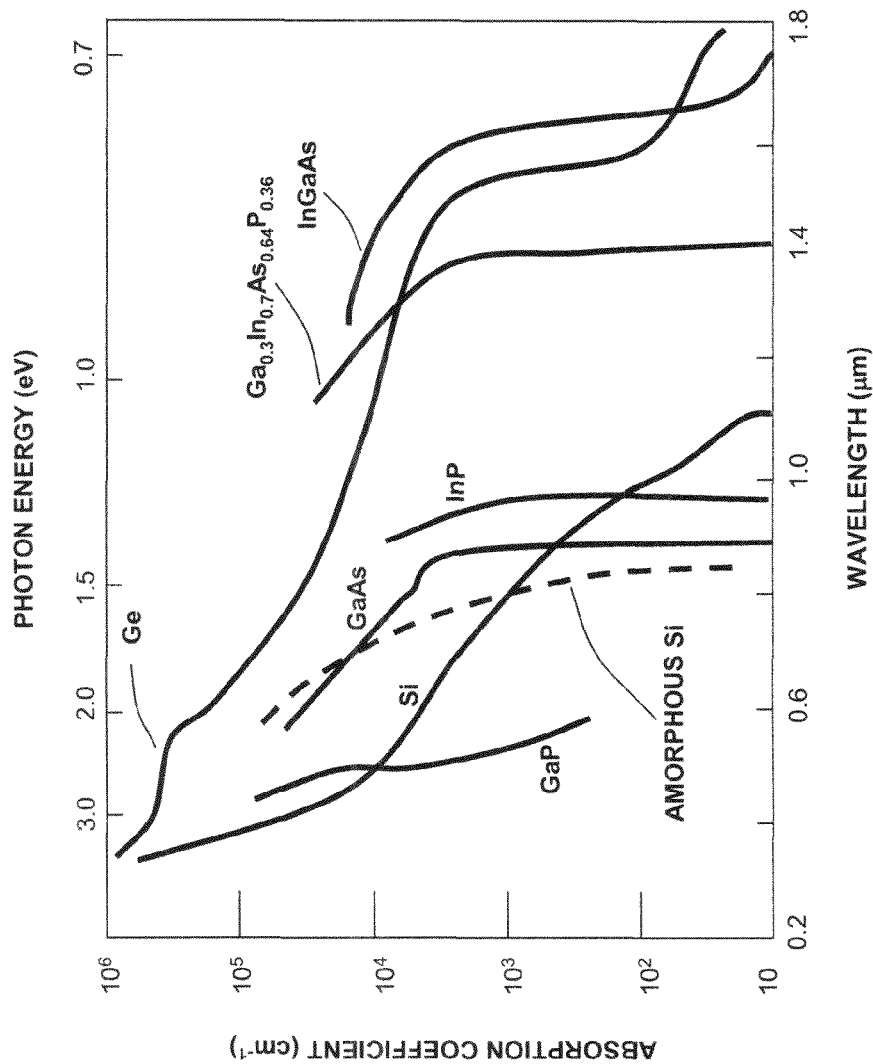
FIG. 2 is a graph of the light absorption coefficients for various semiconductor materials versus wavelength.

A graph of light absorption coefficients for various semiconductor materials versus wavelength is shown in FIG. 2. Absorption coefficient is a measure of the extent to which a material absorbs energy. As shown in the figure, each of the different semiconductor materials exhibits a different respective chromatic sensitivity in its absorption coefficient. Such variability among the different materials provides for substantial flexibility in optimization of the photosensor used within the imaging sensor. The semiconductor materials have different spectral dependencies based on their respective absorption coefficients. Therefore, as the wavelength of an optical input increases, the absorption coefficients generally decrease. As shown, silicon (Si) is fairly linear in the visible spectrum (i.e., for silicon, the absorption coefficient decreases linearly as the wavelength increases from about 4 μm to about 8 μm); however, germanium (Ge) is substantially flat across a large portion of the spectrum (i.e., the absorption coefficient starts off to decrease linearly but flattens off between about 0.6 μm and 1.5 μm).

Figure 3:
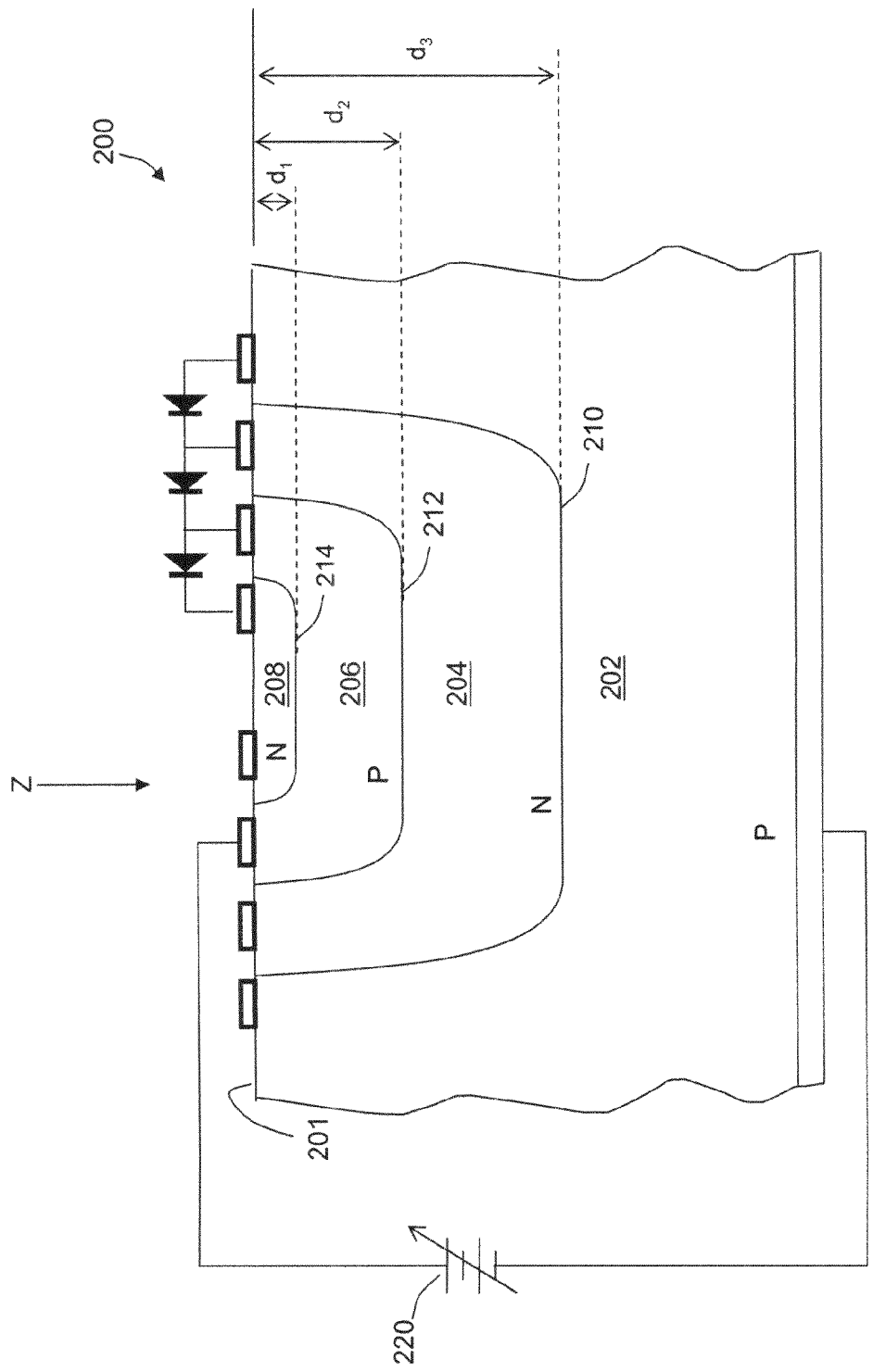
FIG. 3 is a cross-sectional view of an exemplary photosensor structure constructed in accordance with the present invention.

Referring to FIG. 3, an optical sensor portion 200 of an exemplary wide dynamic range imaging sensor element is shown comprising a semiconductor material. In the exemplary embodiment, the semiconductor material includes more than one, for example three substantially planar regions (204, 206, 208) positioned along a principal axis (Z) at different respective depths, in order to form a triple-well photosensor structure. The sensor 200 is configured such that each of the substantially planar regions 204, 206, 208 of the semiconductor material is positioned at a different depth, thereby absorbing a respective portion of an incident optical signal received through the face 201 of the semiconductor material.

The sensor 200 can be formed in a semiconductor material, for example, a silicon substrate 202. In the exemplary embodiment, the silicon substrate 202 is doped to provide a P-type conductivity. The triple-well sensor 200 includes a nested N-type well region 204 formed in a top surface of the P-type silicon substrate 202. A first p-n junction 210 is formed along the boundary of the nested N-doped region 204 and the P-type substrate 202. In some embodiments, the depth of the first junction 210 measured from an optical input surface 201 is selected to approximate an absorption length of red light in silicon (e.g., approximately between about 1.5 and 2.5 μm). Therefore, the first p-n junction 210 formed between the P-region 202 and the deep N-region 204 forms a red-sensitive photodiode between the two adjacent regions.

Similarly, a P-type well region 206, can be formed in a top surface of the nested N-doped region 204. A second p-n junction 212 is formed between the P-doped region 206 and the N-doped region 204. In some embodiments, the depth of the second junction 212 measured from the optical input surface 201 is selected to approximate an absorption length of green light in silicon (e.g., approximately between about 0.5 and 1.5 μm). Therefore, the second p-n junction 212 formed between the P-region 206 and the deep N-region 204 forms a green-sensitive photodiode between the two adjacent regions.

Still referring to FIG. 3, another nested well can be formed by providing a doped region 208 of N-type conductivity within the P-region 206 to a depth such that it may be the approximate absorption length of blue light in silicon (e.g., approximately between about 0.2-0.5 microns). Thus, a third p-n junction 214 is formed between the shallow N-doped region 208 and the P-doped region 206 forming a blue-sensitive photodiode between the two adjacent regions. Although the sensor 100 is described and shown in FIG. 3, as having an N-P-N-P layering in reference to the optical surface 201, it should be well understood that a sensor can be implemented using opposing conductivities (e.g., P-N-P-N) achieving a similar result. Additionally, it should be understood that such a sensor can be implemented using other semiconductor materials, such as germanium and gallium arsenide.

The sensor 200 is configured such that the planar regions of the semiconductor material absorb the optical signal directed in a path incident on the face of the semiconductor material. The sensor 200 is further configured to detect a spatial charge distribution present in the planar regions of the semiconductor material. The planar regions are configured to be at least partially transverse to the principal axis of the incident light. The spatial charge distribution of each of the substantially planar regions has a photo-generation coefficient representative of the absorption of the incident optical signal. The sensor 200 portion when combined with a processing portion 111 (FIG. 1) is further configured to generate an imaging signal representative of an aggregated sum of the spatial charge distributions in each of the three substantially planar regions of the semiconductor material. The integral of the photo-generation coefficient of each of the substantially planar regions over a predetermined wavelength of the incident optical signal is preferably different for each of the substantially planar regions of the semiconductor material.

Although the exemplary junctions 210, 212, and 214 are described as being sensitive to a particular wavelength, more generally the junctions can be formed at any depth within the semiconductor material 202, indiscriminately responding to photons absorbed in the region of each respective junction 210, 212, 214. Generally, more photons are absorbed at shallower depths, such that the shallowest junction (i.e., junction 214) has the greatest sensitivity, being the shallowest junction. Consequently, the shallowest junction 214 would also be most likely to saturate under strong (i.e., bright) optical input. At least some of the incident photons that weren't absorbed in the proximity of the shallowest junction 214 are absorbed at greater depths, such as the depth of the second photodetector junction 212. For semiconductor materials, the number of photons absorbed around the second photodetector junction 212 would generally be less than absorbed for the shallowest junction. Consequently, sensitivity of the second photodetector junction 212 would be less than that of the shallowest junction 214. Thus, although the second junction 212 would not be as sensitive as the shallowest 214, it would be less likely to saturate under the same input optical signal. The shallower layers between the second junction 212 and the surface 201 can be though of as a filter, protecting the second junction 212 from bright signals. Likewise, additional deeper junctions would tend to have even lower sensitivities, being even less susceptible to bright signals.

Figure 4:
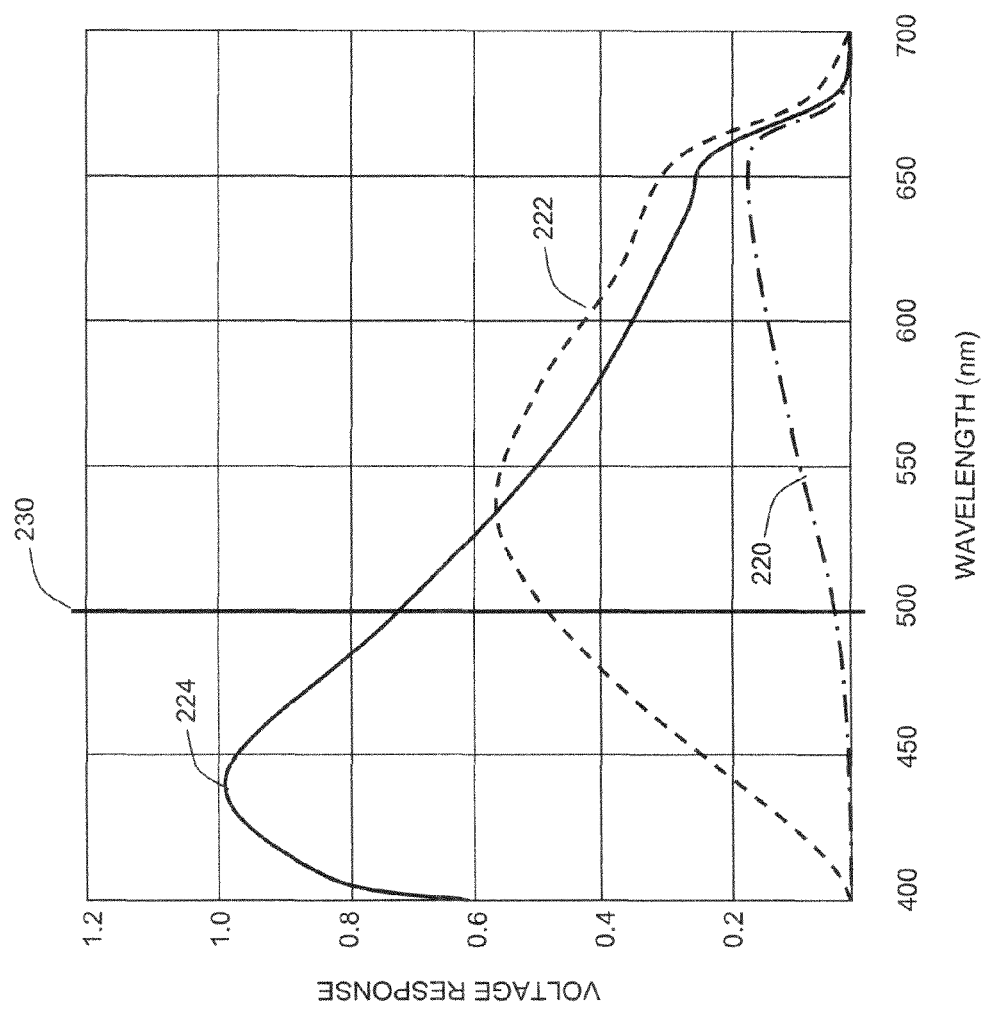
FIG. 4 is a graph of an exemplary normalized voltage response versus wavelength for either of the exemplary embodiments of a wide dynamic range imaging sensor, as shown in FIG. 1, or the photosensor structure, as shown in FIG. 3.

Referring now to FIG. 4, a graph of the voltage responses as a function of wavelength is shown for each of the three p-n junctions of the exemplary sensor 200 (FIG. 3). The sensor 200 can be configured to provide an imaging sensor cell imaging array based on the integrated triple-well structure. Such an imaging array includes a matrix of rows and columns of photocells, with each photocell including the triple-well structure and associated photosensing circuitry. As shown in FIG. 4, the spectral response curves of the different junctions 210, 212, 214 of the sensor 200 differ due to their different depths within the absorbing semiconductor material. The shallowest junction 214 provides the greatest voltage response for a given optical input signal. The middle junction 212 provides a lower voltage response, and the deepest junction 210 provides the lowest voltage response for the given optical input signal. In some embodiments (not shown), the three curves can be normalized, such that the integral of the voltage response across the visible spectrum is approximately equal for each of the different curves.

In more detail, the first curve 220 shows the voltage response of the first junction 210 subject to light of various wavelengths across the visible spectrum. There is a strong peak in the voltage response for incident light having wavelengths between about 610 to 660 nm. The shape of the first curve 220 indicates that the voltage response at shorter wavelengths is substantially less. Favoring the longer wavelengths (i.e., red) is due at least in part to placement of the first junction 210 at the absorption length for red light in silicon.

A second curve 222 shows the voltage response of the second junction 212 subject to light of various wavelengths across the visible spectrum. There is a broad peak in the voltage response for incident light having wavelengths between about 500 to 600 nm. The shape of the second curve 222 indicates that the voltage response at both longer and shorter wavelengths is substantially less. Favoring the wavelengths in the middle of the visible spectrum (i.e., green) is due at least in part to placement of the second junction 212 at the absorption length for green light in silicon.

A third curve 224 shows the voltage response of the third junction 214 subject to light of various wavelengths across the visible spectrum. There is a sharp peak in the voltage response for incident 224 indicates that the voltage response at longer wavelengths is substantially less. Favoring the wavelengths in the near of the visible spectrum (i.e., blue) is due at least in part to placement of the third junction 214 at the absorption length for blue light in silicon.

Figure 5:
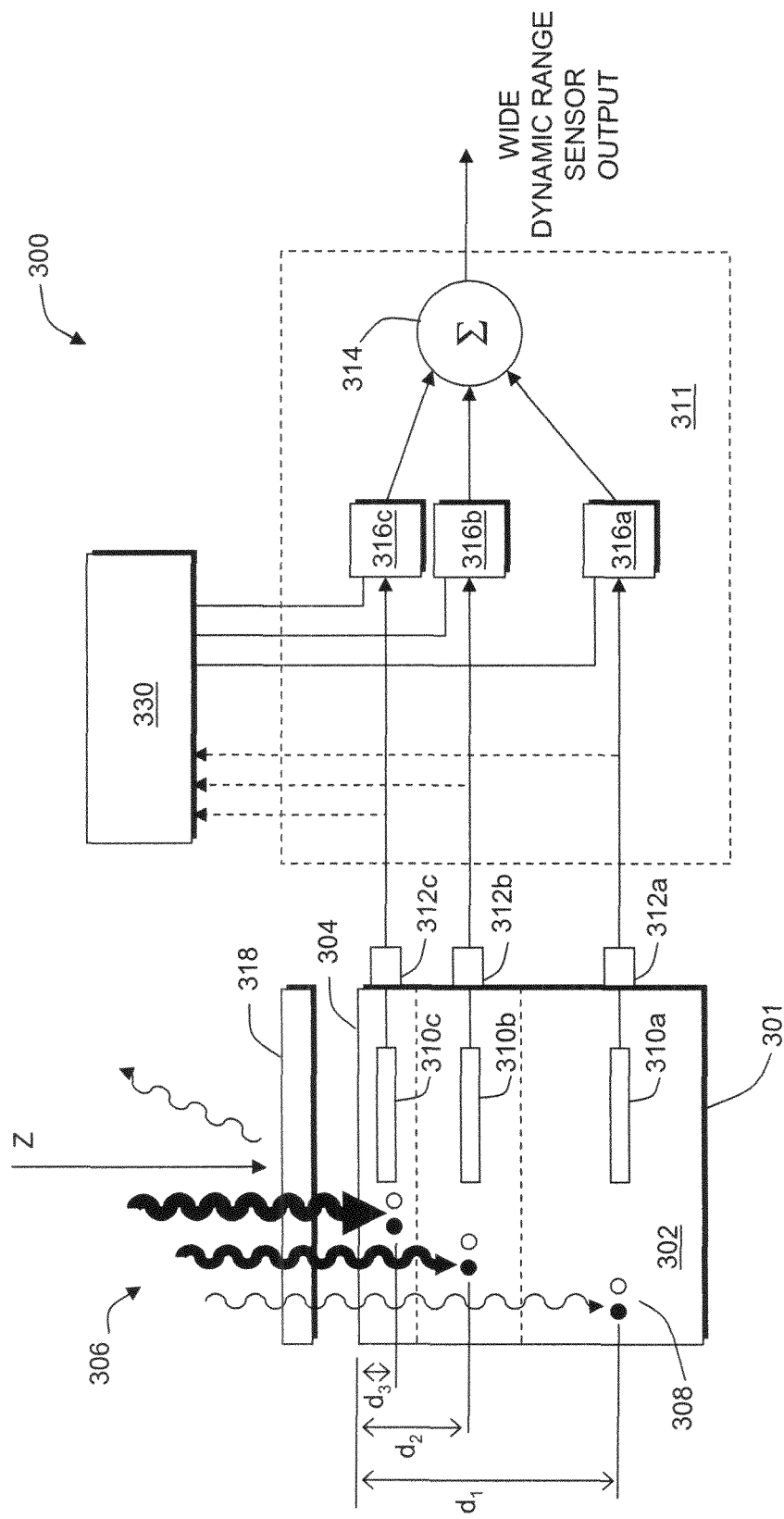
FIG. 5 is a schematic diagram of an alternative exemplary embodiment of a wide dynamic range imaging sensor element constructed in accordance with the present invention.

Referring now to FIG. 5, an alternative embodiment of a wide dynamic range imaging sensor 300 is shown including a filtered sensor portion 301 and a processing portion 311. The sensor 300 can be a pixel of a larger array of sensors. The sensor portion 301 includes a semiconductor material 302 having an optical input surface 304 for receiving incident optical input. An optical filter 318 is positioned between the optical input surface 304 and an optical input. Three photosensors 310a, 310b, 310c (generally 310) are disposed at different depths (i.e., $d_1$, $d_2$, $d_3$, respectively) within the semiconductor material 302, similar to the arrangement shown in FIG. 1. Each of the photosensors 310 is in electrical communication with a respective output terminal 312a, 312b, 312c (generally 312). Each of the output terminals 312 is connected to the processing portion 311, which also includes a signal combiner 314. The signal combiner 314 combines output signals from more than one of the individual photosensors 310 to produce a wide dynamic range output signal.

Received signal from the shallowest photosensor 310c provides a higher-end portion of a dynamic range for a combined response. Likewise, received signal from the middle photosensor 310b provides a mid-portion of the dynamic range, while received signal from the deepest photosensor 310a provides a lower-end portion of the dynamic range for the combined response. Beneficially, the combined dynamic range of the multi-photosensor 310 device 300 is greater than the dynamic range of any one of the individual photosensors 310. Referring again to FIG. 3, absorption depths of one or more of the junctions 210, 212, and 214 is controllable. For example, an external circuit, such as a reverse biasing circuit 220 can be applied to effect one or more of a width of the junction depletion region, or the effective depth of the junction itself. In some embodiments, the biasing circuit 220 is fixed. Alternatively or in addition, one or more biasing circuits 220 are variable, such as the variable voltage source 220 shown.

In some embodiments, referring again to FIG. 5, the processing portion 311 includes one or more signal conditioning elements 316a, 316b, 316c (generally 316). In the illustrative embodiment, a respective one of the signal conditioning elements 316 is coupled between each output terminal 312 and the signal combiner 314. Each of the signal conditioning elements 316 and the combiners 314 can be constructed similar to the signal conditioning elements 116 and the combiners 114 described in relation to FIG. 1.

In some embodiments the signal conditioning elements 316 are controllable. As shown in FIG. 5, the processing portion 311 can include a controller 330 in electrical communication with each of the signal conditioning elements 316. The controller 330 provides a respective control signal to each the signal conditioning elements 316 to selectively control the input signals to the signal combiner 314. Thus, the controller 330 in combination with controllable conditioning elements 316 can be used to selectively adjust the wide dynamic range sensor output. In some embodiments, the controller 330 is also in communication with each of the electrical contacts 312 to monitor electrical output signals therefrom. To at least some degree, signal conditioning provided by the signal conditioning elements 316 can be used to alter sensitivity of its respective photosensors 310. Namely, amplification or gain can be added by the signal conditioning elements 316 to enhance dynamic range. Alternatively or in addition attenuation can be added by the signal conditioning elements 316 to alter dynamic range.

In some embodiments, the controller 330 implements preprogrammed instructions for adjusting one or more of the signal conditioning elements 316, thereby producing a wide dynamic range sensor output. Such programmed instructions can tailor operation of the signal conditioning elements 316 according to application, time of day, day of year, the wide dynamic range sensor output itself, combined dynamic range sensor output of an array of devices 300, etc. Alternatively or in addition, the controller 330 includes a user input (not shown). The user input can be used to adjust one or more of the signal conditioning elements 316 manually, or in combination of preprogrammed logic implemented by the controller 330. In some embodiments, a single controller 330 controls the signal conditioning elements 316 of more than one sensors 300 of an array of sensors.

The optical filter 318 provides yet another approach in altering responsivity of the photosensors 310. For example, a neutral density filter 308 can reduce a saturation threshold of all of the photosensors 310 by a substantially uniform amount by blocking a portion of incident photons. Such a filter can be added for bright applications, such as outside daylight, and removed or replaced with different filters 308 for indoor or nighttime applications. Alternatively or in addition, the optical filter 318 is not a neutral density filter. Thus, the filter can provide a responsivity that is low pass, high pass, or band pass.

Figure 6:
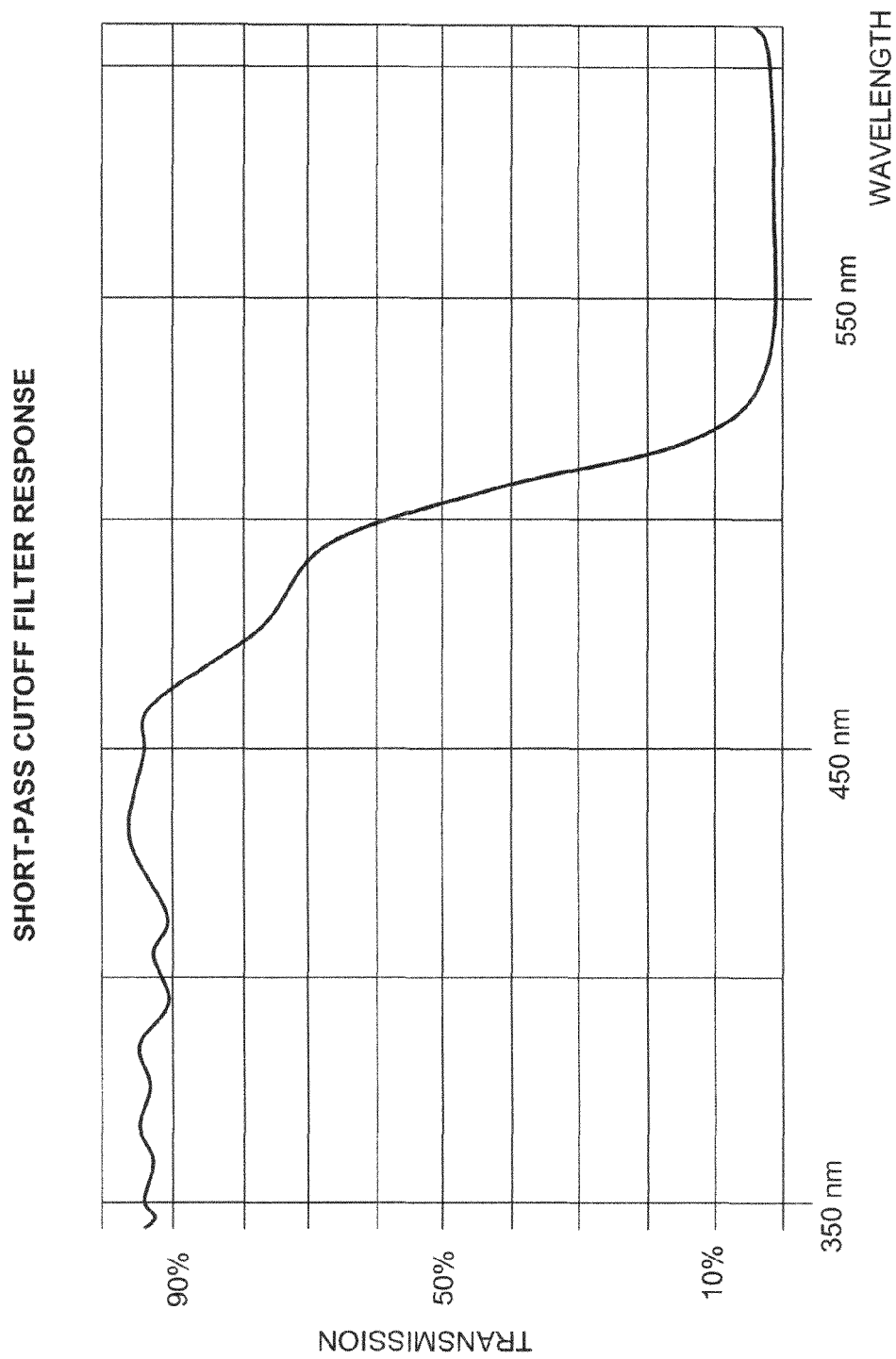
FIG. 6 is a graph illustrating filter responsivity of an exemplary filter usable within the present invention.

Referring again to the graph of FIG. 4 a vertical line 230 is provided representing a cutoff wavelength of an exemplary optical filter. In the illustrative example, the cutoff wavelength is about 500 nm. A response curve for an exemplary short pass filter having a cutoff wavelength of about 500 nm is illustrated in FIG. 6. This curve was obtained from a dichroic optical filter. For the exemplary short pass filter, wavelengths shorter than the cutoff wavelength of 500 nm are allowed to pass through the filter with minimal effects (e.g., loss), while wavelengths above the cutoff frequency are substantially prohibited from passing therethrough.

Figure 7:
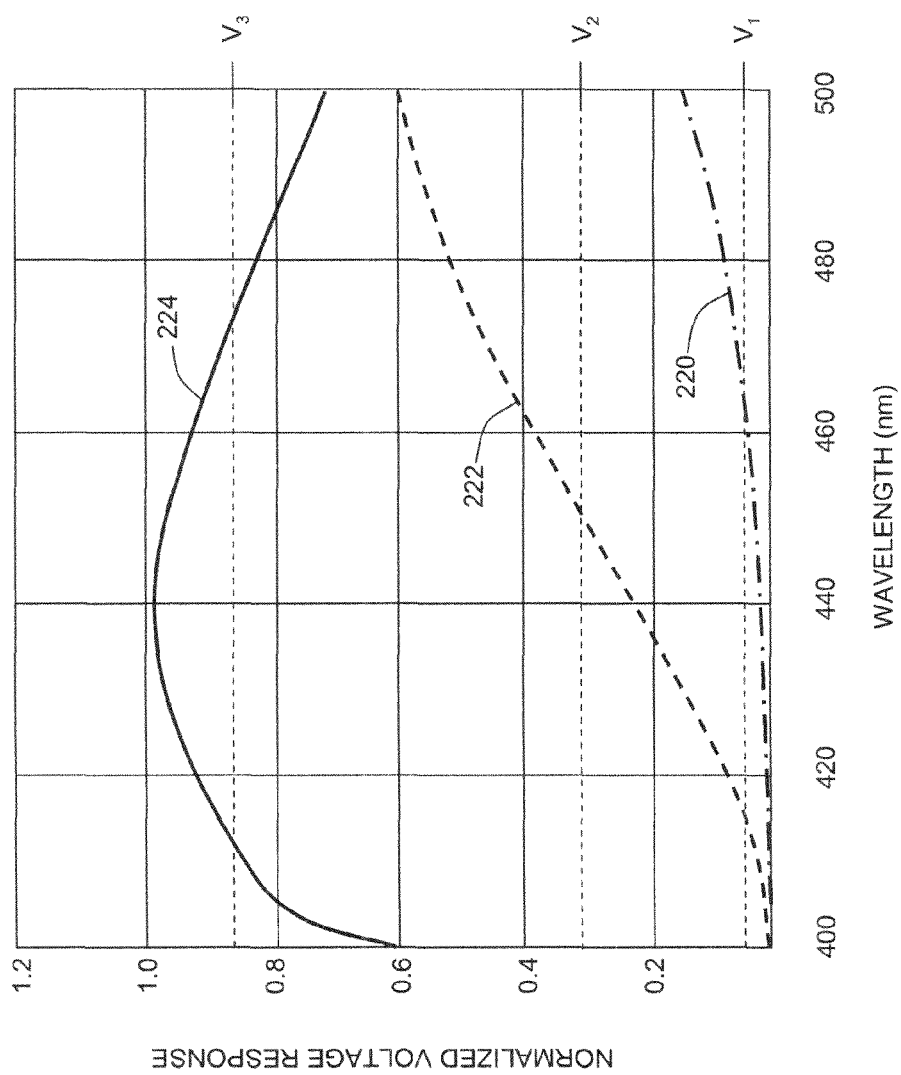
FIG. 7 is a graph of a voltage response versus wavelength for an optically filtered, wide dynamic range imaging sensor constructed in accordance with the present invention.

A revised graph is provided in FIG. 7, showing that portion of the spectrum of FIG. 4 below the cutoff frequency of about 500 μm. The responsivities 220, 222, 224 for each of the three p-n junctions of the exemplary sensor 200 (FIG. 3) are substantially different within this region. The relative responsivities of the different p-n junctions approximate the integrated signal over this bandwidth. A mean value can be calculated for each of the responsivity curve by integrating the curve over the bandwidth (400-500 μm) and dividing the result by the bandwidth (i.e., 100 μm). The mean values $V_1, V_2, V_3$ are shown as horizontal lines on the same graph. Limiting operation of the sensor 200 (FIG. 3) to a bandwidth below cutoff using the optical filter 318 (FIG. 5) results in a substantial difference in response for each of the p-n junctions. Such variability among the different materials provides for substantial flexibility in optimization of the photosensor used within the imaging sensor. For a strong optical input, it may be advantageous to select an output from one or more of the sensors having a lesser response value. Likewise, for a weak optical input, it may be advantageous to select an output from one or more of the sensors having a greater response value.

Accordingly, the device 300 (FIG. 5) can provide an enhanced dynamic range using one or more of an optical filter 318, different depths of the photosensors 310, and signal conditioning 316 (e.g., gain). Depths of the photosensors 310 can be controlled by fabrication of the actual junctions by selecting depths of the respective junctions. Alternatively or in addition, effective depths of the photosensors 310 can be controlled by application of biasing circuitry (e.g., variable source 220 shown in FIG. 3). In some embodiments, biasing circuitry when provided is controlled by the controller 330 (FIG. 5).

Figure 8:
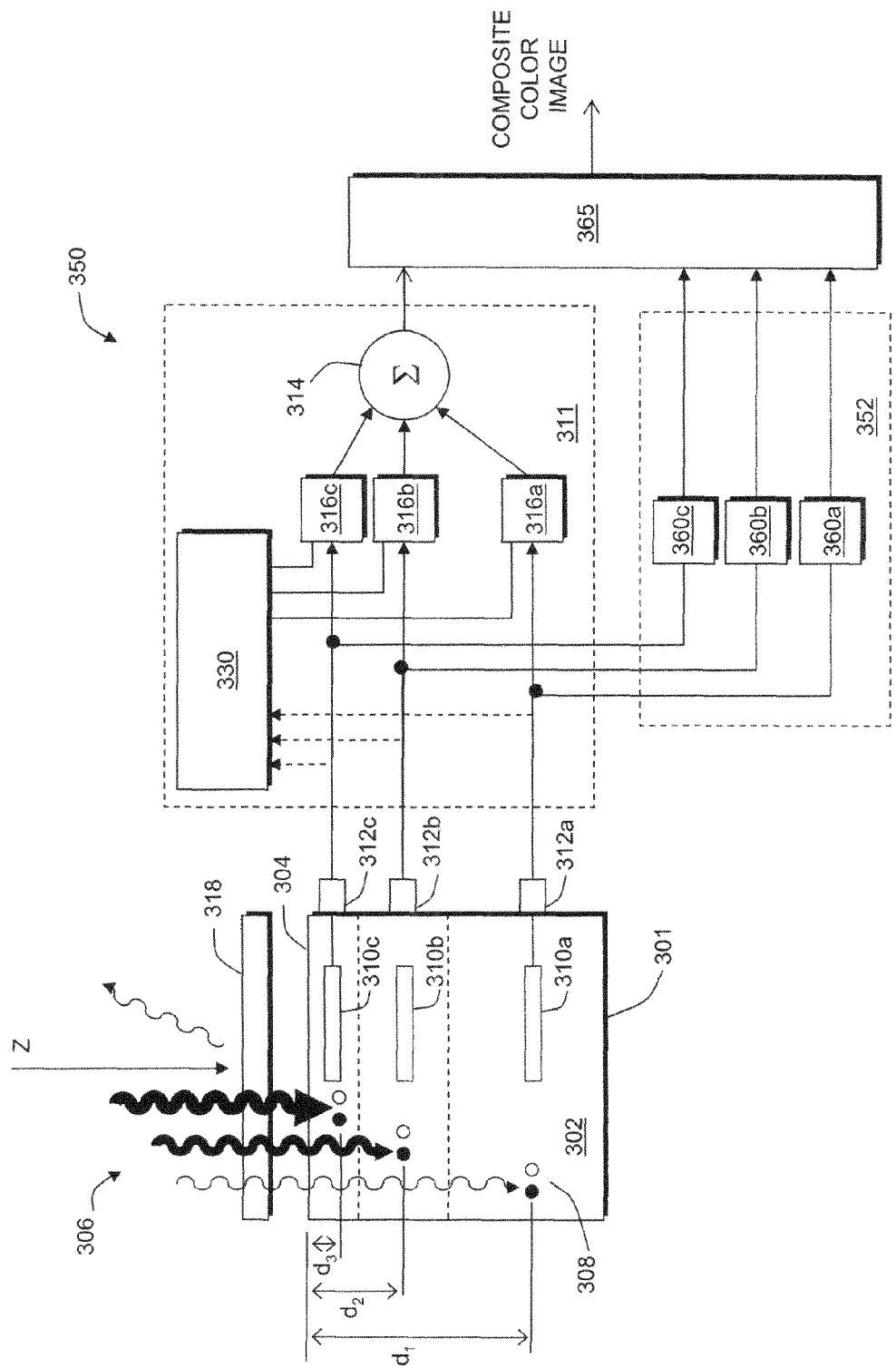
FIG. 8 is a schematic diagram of another alternative exemplary embodiment of a wide dynamic range imaging sensor element constructed in accordance with the present invention.

In an alternative embodiment of an image sensor 350 shown in FIG. 8, a wide dynamic range output from a wide dynamic range sensor 311, can be combined with a color image obtained from a color sensor 352 to form a combined wide dynamic range color image. Once again, the individual sensors 350 can be combined in an array of similar sensors 350 forming an image sensor. Operation of the wide dynamic range sensor can be similar to the sensor 300 described in relations to FIG. 5. When the individual photosensors 310 are positioned as described above to selectively absorb light of a preferred wavelength, additional signal conditioning elements 360a, 360b, 360c (generally 360) can be applied respectively to each of the photosensor 310 outputs to normalize the respective responsivity of each of the different colors. In a particular embodiment, the photosensors 310 are positioned in silicon to selectively absorb red, green, and blue photons. The resulting red, green, and blue output signals are normalized by the signal conditioning elements 360, and can be used in reproducing a combined colored output that is representative of the colored input. A signal combiner 365 combines the red, green, blue signals with the wide dynamic range signal to produce a composite signal. For example, the composite signal can be an overlay of a color image and the wide dynamic range image.

Figure 9:
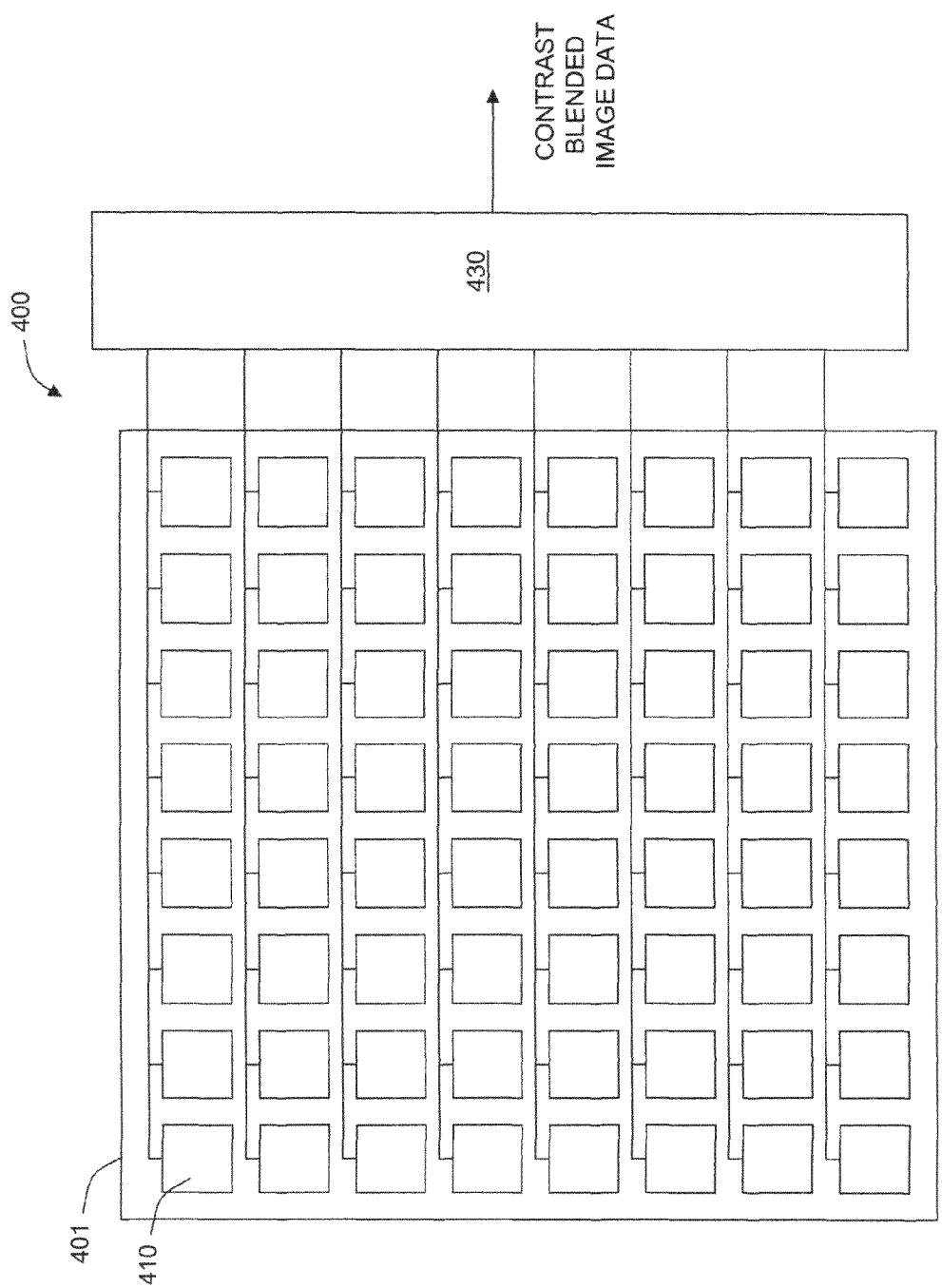
FIG. 9 is a schematic diagram of an exemplary image sensor including wide dynamic range imaging sensor elements constructed in accordance with the present invention.

In some embodiments, referring now to FIG. 9, a multi-pixel image sensor 400 can be formed from an array 401 of imaging sensors 410, such as those described in relation to FIG. 1, FIG. 3, FIG. 5, and FIG. 8. In some embodiments, each imaging sensor 410 of the array 401 respectively includes a sensor portion 101, 301 and processing portion 111, 311 (FIG. 1, FIG. 5). Alternatively or in addition, a common controller 430 can be used to control output signals from more than one imaging sensors 410. For example, each pixel in a multi-pixel display, such as the Foveon Fx17-78-F13 image sensor, includes a respective sensor portion 301. Providing three separate outputs for the red, green, and blue. the image sensor 500 includes three substantially planar regions (502, 504, 506) positioned along a principal axis (Z), thereby forming a planar array triple-well photosensor structures 501. Each individual imaging sensing element, or pixel 410, in the array 401 of pixels is configured such that there are multiple integrating wells, with a different integrating well positioned in each of the multiple respective planar regions. The integrating wells are preferably, non-intersecting, at least partially transverse to the reference axis, and mutually spaced apart along the principal axis, at different respective depths from an optical input surface.

Each of the individual pixels 410 is in communication with a common signal processing module 413 to control output signals from one or more of the image sensors to increase dynamic range of an optical input. For example, signal processing module 430 can include multiple signal conditioning elements 316 and multiple signal combiners 314 (FIG. 5), one for each of the pixels 410. In some embodiments, the signal processing module 430 include a controller 330 (FIG. 5) for controlling conditioning and/or combining of the multiple output signals for each pixel 410, similar to that described in relation to FIG. 5. In some embodiments, control is performed or augmented by an external controller, such as a personal computer. The processing module 430 can be used to control dynamic range by using contrast blending techniques.

Figure 10:
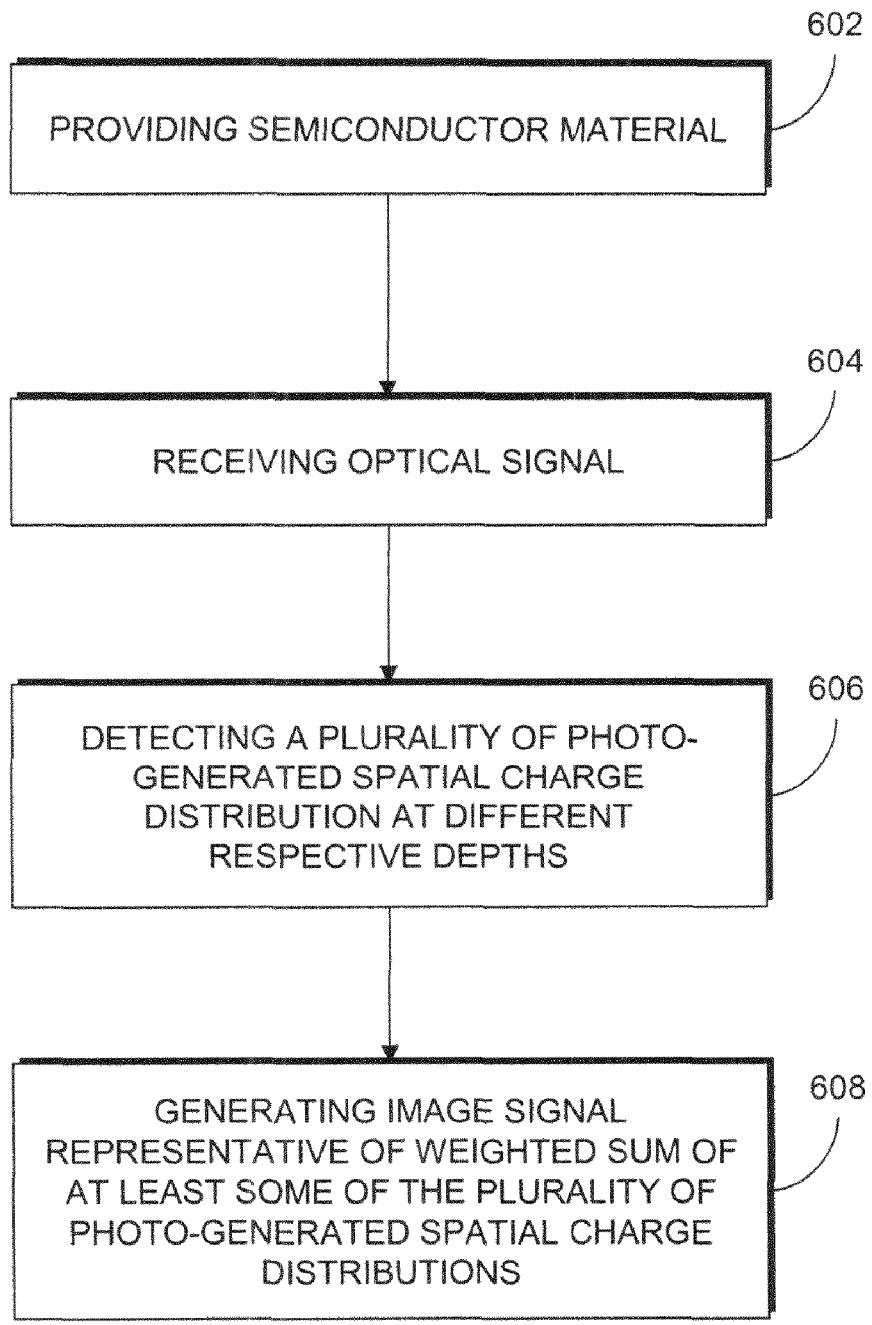
FIG. 10 illustrates the steps implemented in an embodiment of the photosensor according to the present invention.

Referring now to FIG. 10, the method to implement an embodiment of this invention are shown. In step 602, a semiconductor block, in the form of sensor 200 (shown in FIG. 3), is provided, wherein the semiconductor extends from an input face along a reference axis. Selected points in the semiconductor block are preferably characterized by hole-electron pair photocharge generation coefficient as a function of wavelength of an incident optical signal (e.g., incident illumination) across a predetermined wavelength range. In step 604, an optical signal is directed to be incident on the input face of the semiconductor block, in order to generate a photo-generated spatial charge distribution in the semiconductor block. In step 606, the photo-generated spatial charge distribution resident in more than one substantially planar regions of the semiconductor block is preferably detected. The semiconductor block of sensor 100 is preferably configured such that the more than one of the substantially planar regions are (i) non-intersecting, (ii) at least partially transverse to the reference axis, (iii) mutually spaced apart along the reference axis (i.e., at different respective depths), and (iv) overlapping in the direction of the reference axis. In step 608, an image signal representative of a weighted sum of the detected spatial charge distributions for at least some of the more than one substantially planar regions of the semiconductor block is preferably generated. In some embodiments, each of the weights of the weighted sum is proportional to the integral of the photocharge generation coefficient over the predetermined wavelength range for the respective substantially planar region.

Figure 11:
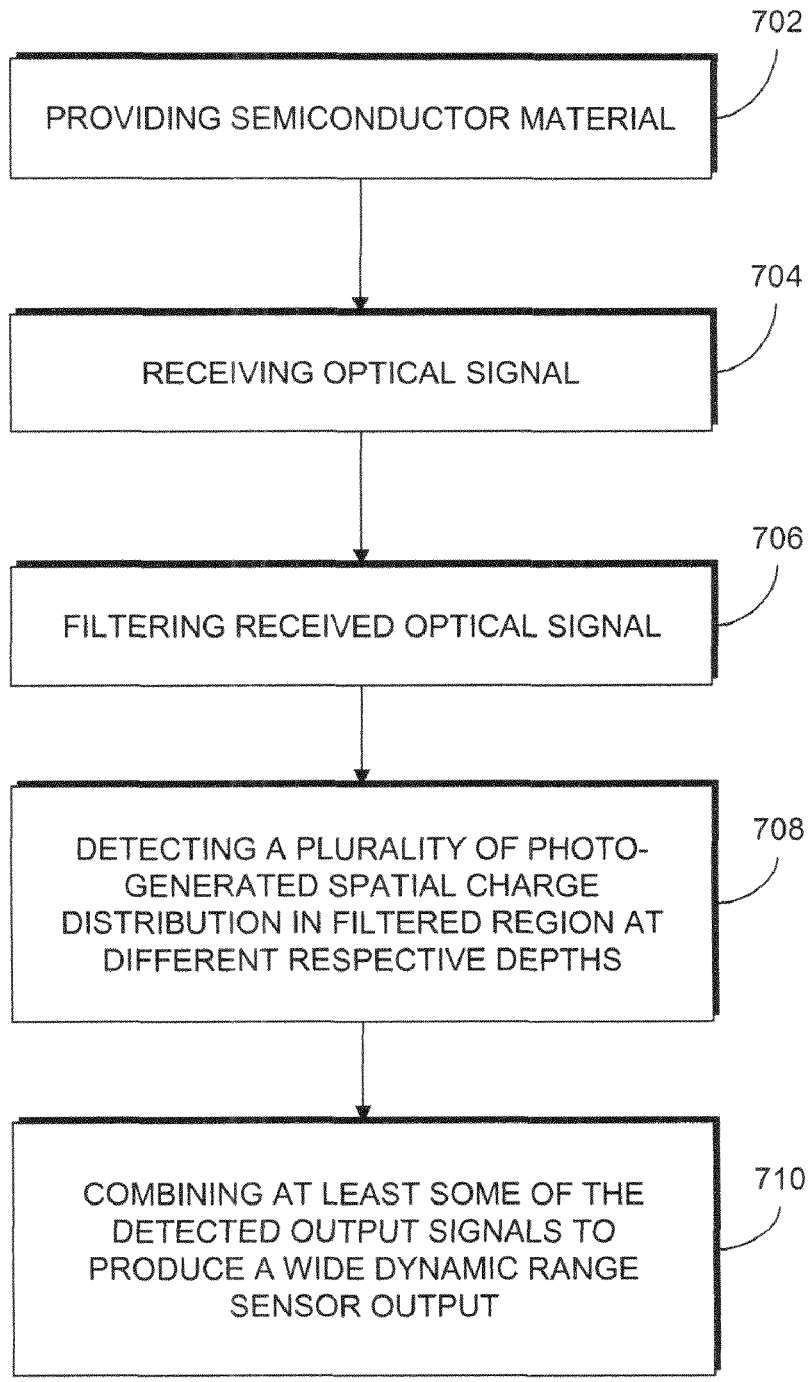
FIG. 11 illustrates the steps implemented in an embodiment of the wide dynamic range imaging sensor according to the present invention.

Now referring to FIG. 11, the method to implement an alternative embodiment of this invention are shown. In step 702, a semiconductor block, in the form of sensor 300 (shown in FIG. 5), is provided, wherein the semiconductor extends from an input face along a reference axis. Selected points in the semiconductor block are preferably characterized by hole-electron pair photocharge generation coefficient as a function of wavelength of an incident optical signal (e.g., incident illumination) across a predetermined wavelength range. In step 704, an optical signal is directed to be incident on the input face of the semiconductor block, in order to generate a photo-generated spatial charge distribution in the semiconductor block. In step 706, the received optical input is filtered to pass optical input wavelengths within a preferred spectral region. In step 708, the photo-generated spatial charge distribution resident in more than one substantially planar regions of the semiconductor block is preferably detected. The semiconductor block of sensor 100 is preferably configured such that the more than one substantially planar regions are (i) non-intersecting, (ii) at least partially transverse to the reference axis, (iii) mutually spaced apart along the reference axis (i.e., at different respective depths), and (iv) overlapping in the direction of the reference axis. In step 710, a wide dynamic range image signal is produced by a combination of the detected spatial charge distributions for the more than one substantially planar regions of the semiconductor block.

The invention has been described with reference to drawings. The drawings illustrate certain details of specific embodiments that implement the systems and methods and programs of the present invention. However, describing the invention with drawings should not be construed as imposing on the invention any limitations that may be present in the drawings. The present invention contemplates methods, systems and program products on any machine-readable media for accomplishing its operations. The embodiments of the present invention may be implemented using an existing computer processor, or by a special purpose computer processor incorporated for this or another purpose or by a hardwired system.

As noted above, embodiments within the scope of the present invention include program products comprising machine-readable media for carrying or having machine-executable instructions or data structures stored thereon. Such machine-readable media can be any available media which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such a connection is properly termed a machine-readable medium. Combinations of the above are also included within the scope of machine-readable media. Machine-executable instructions comprise, for example, instructions and data which cause a general purpose computer, special purpose computer, or special purpose processing machines to perform a certain function or group of functions.

Embodiments of the invention have been described in the general context of method steps which may be implemented in one embodiment by a program product including machine-executable instructions, such as program code, for example in the form of program modules executed by machines in networked environments. Generally, program modules include routines, programs, objects, components, data structures, etc. that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the diagrams herein may show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the invention. Likewise, software and web implementations of the present invention could be accomplished with standard programming techniques with rule based logic and other logic to accomplish the various database searching steps, correlation steps, comparison steps and decision steps. It should also be noted that the word "component" as used herein and in the claims is intended to encompass implementations using one or more lines of software code, and/or hardware implementations, and/or equipment for receiving manual inputs.

The foregoing description of embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principals of the invention and its practical application to enable one skilled in the art to utilize the invention in various embodiments and with various modifications as are suited to the particular use contemplated.

What is claimed is:

1. A method for generating a wide dynamic range image, comprising the steps of:

providing a semiconductor block extending from an input face along a reference axis, wherein points in the semiconductor block are characterized by hole-electron pair photocharge generation coefficient as a function of wavelength of incident illumination across a predetermined wavelength range;

directing an optical signal to be incident on the input face, to generate a photo-generated spatial charge distribution in the semiconductor block;

detecting the photo-generated spatial charge distribution resident in a plurality of substantially planar regions of the semiconductor block, wherein the plurality of substantially planar regions are (i) non-intersecting, (ii) at least partially transverse to the reference axis, (iii) mutually spaced apart along the reference axis, and (iv) overlapping in the direction of the reference axis; and generating an image signal representative of a weighted sum of the detected spatial charge distributions for the plurality of substantially planar regions of the semiconductor block, wherein each of the weights of the weighted sum is proportional to the integral of the photocharge generation coefficient over the predetermined wavelength range for the respective substantially planar region;

wherein the semiconductor block includes a plurality of stacked signal integration wells at a single pixel location; and wherein the stacked signal integration wells are configured to perform contrast blending at each pixel location.

2. The method of claim 1, wherein the stacked signal integration wells are positioned vertical to one another.

3. The method of claim 1, wherein the stacked signal integration wells are characterized by a monotonically increasing attenuation factor as a function of depth of each of the integration wells.

4. The method of claim 1, wherein the detecting of the photo-generated spatial charge distribution in the semiconductor block is a function of the wavelength.

5. The method of claim 1, wherein the optical signal comprises light.

6. A method for capturing a wide dynamic range image using a semiconductor material, the semiconductor material including a plurality of substantially planar regions positioned along a principal axis, the steps of the method comprising:

exposing the semiconductor material to an optical signal, the optical signal being directed in a path substantially incident on a face of the semiconductor material, wherein the semiconductor material is configured such that the plurality of substantially planar regions absorb the incident optical signal;

detecting a spatial charge distribution present in the plurality of substantially planar regions of the semiconductor material, wherein the planar regions are configured to be at least partially transverse to the principal axis, the spatial charge distribution of each of the substantially planar regions having a photo-generation coefficient representative of the absorption of the incident optical signal; and generating an imaging signal representative of an aggregated sum of the spatial charge distributions in each of the plurality of substantially planar regions of the semiconductor material, wherein the integral of the photo-generation coefficient of each of the substantially planar regions over a predetermined wavelength of the incident optical signal is different for each of the substantially planar regions of the semiconductor material;

wherein the step of exposing the semiconductor material is performed in a single frame;

wherein the semiconductor material includes a plurality of stacked signal integration wells at a single pixel location, and wherein the stacked signal integration wells are configured to perform contrast blending at each pixel location.

7. The method of claim 6, wherein the plurality of substantially planar regions of the semiconductor material are mutually spaced apart along a principal axis.

8. The method of claim 6, wherein the plurality of substantially planar regions of the semiconductor material are non-intersecting.

9. The method of claim 6, wherein the stacked signal integration wells are positioned vertical to one another.

10. The method of claim 6, wherein the stacked signal integration wells are characterized by a monotonically increasing attenuation factor as a function of depth of each of the integration wells.

11. The method of claim 6, wherein the absorption of the incident optical signal in the semiconductor material is a function of the wavelength.

12. The method of claim 6, wherein the optical signal comprises light.

13. The method of claim 6, wherein photo-generation coefficient is a function of the wavelength of the incident optical signal over predetermined wavelength range.

* * * * *